United States Patent [19]
Merrill

[11] Patent Number: 6,066,510
[45] Date of Patent: May 23, 2000

[54] METHOD FOR FORMING A PHOTODIODE WITH IMPROVED PHOTORESPONSE BEHAVIOR

[75] Inventor: Richard Billings Merrill, Daly City, Calif.

[73] Assignee: Foveon, Inc., Santa Clara, Calif.

[21] Appl. No.: 09/073,100

[22] Filed: May 5, 1998

Related U.S. Application Data

[62] Division of application No. 08/734,114, Oct. 21, 1996, Pat. No. 5,747,840.

[51] Int. Cl.$^7$ .............................. H01L 21/00; H01L 31/00
[52] U.S. Cl. ................................ 438/57; 438/237; 438/91
[58] Field of Search .............................. 438/57, 141, 237, 438/328, FOR 415, FOR 416, 91, 70

[56] References Cited

U.S. PATENT DOCUMENTS 5,614,744   3/1997   Merrill .

FOREIGN PATENT DOCUMENTS 3-290979   12/1991   Japan .............................. H01L 31/10

OTHER PUBLICATIONS

Aw, C. H. et al., "FA 11.2: A 128x128–Pixel Standard–CMOS Image Sensor with Electronic Shutter," 1996 IEEE International Solid–State Circuits Conference, pp. 180–181; pp. 140–141 & p. 397.

Ando, F. et al., "A 250,000–Pixel Image Sensor with FET Amplification at Each Pixel for High–Speed Television Cameras," IEEE International Solid–State Circuits Conference, Feb. 16, 1990, pp. 212–213.

*Primary Examiner*—Mary Wilczewski
*Attorney, Agent, or Firm*—Limbach & Limbach L.L.P.

[57] ABSTRACT

The quantum efficiency of a photodiode is substantially increased by forming the photodiode on a heavily-doped layer of semiconductor material which, in turn, is formed on a semiconductor substrate. The heavily-doped layer of semiconductor material tends to repel information carriers in the photodiode from being lost to the substrate, and prevents noise carriers from the substrate from diffusing up into the photodiode. In addition, the red and blue photoresponses are balanced by adjusting the depth of the photodiode.

13 Claims, 2 Drawing Sheets

METHOD FOR FORMING A PHOTODIODE WITH IMPROVED PHOTORESPONSE BEHAVIOR

RELATED APPLICATIONS

This application is a divisional of Ser. No. 08/734,114 filed on Oct. 21, 1996, now U.S. Pat. No. 5,747,840. This application is related to Ser. No. 08/734,647, titled Silicon On Insulator (SOI) Isolated Photodiode by Richard B. Merrill, filed on Oct. 21, 1996, now abandoned.

BACKGROUND OF THE INVENTION

1. Field of the Invention

The present invention relates to photodiodes and, more particularly, to a photodiode with improved photoresponse behavior.

2. Description of the Related Art

Conventional imaging circuits rely on photodiodes to convert a pixel of light energy into an electrical charge that represents the intensity of the light energy. In general, the light energy varies the electrical charge in a manner which is proportional to the photon absorption rate.

FIG. 1 shows a cross-sectional diagram that illustrates a conventional p+/n photodiode 10. As shown in FIG. 1, photodiode 10 includes an n-type substrate 12, and a p+ region 14 which is formed in substrate 12.

In operation, p+ region 14 is initially reverse-biased with respect to n-type substrate 12, and then floated. Under these conditions, light energy, in the form of photons, strikes photodiode 10, thereby creating a number of electron-hole pairs in substrate 12 and p+ region 14. As shown in FIG. 1, the holes formed in n-type substrate 12 diffuse to the p-n junction where they are swept to p+ region 14 under the influence of the electric field at the junction, while the electrons are attracted to the positive voltage applied to n-type substrate 12.

Similarly, the holes formed in p+ region 14 remain in region 14, while the electrons formed in p+ region 14 diffuse to the p-n junction where they are swept to n-type substrate 12. Thus, with the addition of each photogenerated hole in p+ region 14, the voltage on p+ region 14 is correspondingly increased. As a result, photodiode 10 varies the voltage on p+ region 14 in a manner which is proportional to the photon absorption rate.

One of the major disadvantages of photodiode 10 is that photodiode 10 is susceptible to thermally-generated, as well as other, sources of noise. For example, holes originating from thermally-generated electron-hole pairs formed in substrate 12 diffuse up from n-type substrate 12 into p+ region 14 where each additional hole erroneously represents another photon.

One technique for limiting the effect of noise is to use a p+/n-well photodiode. FIG. 2 shows a cross-sectional diagram that illustrates a conventional p+/n-well photodiode 20. As shown in FIG. 2, photodiode 20 includes an n-well 24 which is formed in a p-type substrate 22, and a p+ region 26 which is formed in n-well 24.

In operation, n-well 24 is reverse-biased with respect to p-type substrate 22 by applying a negative voltage to substrate 22, and a positive voltage to n-well 24. In addition, p+ region 26 is initially reverse-biased with respect to n-well 24, and then floated.

Under these conditions, the holes formed in n-well 24 diffuse to the p-n junction where they are swept to p+ region 26 under the influence of the electric field, while the electrons are attracted to the positive voltage applied to n-well 24. Similarly, the holes formed in p+ region 26 remain in region 26, while the electrons formed in p+ region 26 diffuse to the p-n junction where they are swept to n-well 24 and then collected by the positive voltage applied to n-well 24. Thus, as with photodiode 10, the addition of each photogenerated hole in the p+ region correspondingly increases the voltage on the p+ region.

The principal advantage of photodiode 20 is that by maintaining a reverse-bias across the well-to-substrate junction, holes from thermally-generated as well as other noise sources originating in substrate 22 are prevented from diffusing up from substrate 22 into p+ region 26 by the p-n junction.

Instead, the holes in substrate 22 are attracted to the negative voltage applied to substrate 22, while the electrons in substrate 22 from these electron-hole pairs diffuse to the p-n junction where they are swept to n-well 24 and then collected by the positive voltage applied to n-well 24. Thus, a p+/n-well photodiode significantly reduces the level of noise.

One major problem with photodiode 20, however, is that photodiode 20 has a relatively poor quantum efficiency. As further shown in FIG. 2, in addition to diffusing to p+ region 26, photogenerated holes formed in n-well 24 can also diffuse to substrate 22 where these holes, and the photo-information they represent, are lost. In a typical CMOS process, about one-half of the photogenerated holes formed in n-well 24 are lost to substrate 22.

Thus, there is a need for a structure which increases the quantum efficiency of photodiode 20 while at the same time maintaining the noise resistance of photodiode 20.

SUMMARY OF THE INVENTION

Conventional p+/n-well photodiodes suffer from a low quantum efficiency because many of the photogenerated holes in the n-well are lost to the p-type substrate. In the present invention, the quantum efficiency of a p+/n-type photodiode is increased by forming the photodiode on a heavily-doped layer of n-type semiconductor material which, in turn, is formed on a p-type semiconductor substrate.

The heavily-doped layer of n-type semiconductor material tends to repel photogenerated holes formed in the n-type layer from being lost to the substrate, thereby increasing the quantum efficiency. In addition, the heavily-doped layer of n-type semiconductor material also prevents holes from the substrate, which represent noise, from diffusing up into the photodiode, thereby maintaining the noise reduction common of p+/n-well photodiodes.

A photodiode in accordance with the present invention, which is formed in a semiconductor substrate of a first conductivity type, includes a first layer of semiconductor material of a second conductivity type formed on the substrate, a second layer of semiconductor material of the second conductivity type formed on the first layer of semiconductor material, where the dopant concentration of the first layer is greater than the dopant concentration of the second layer, and a region of the first conductivity type formed in the second layer of semiconductor material.

In addition, the red and blue photoresponses of the photodiode are balanced by adjusting the depth of the second layer of semiconductor material to a predetermined depth.

A better understanding of the features and advantages of the present invention will be obtained by reference to the following detailed description and accompanying drawings which set forth an illustrative embodiment in which the principles of the invention are utilized.

DETAILED DESCRIPTION

Figure 3:
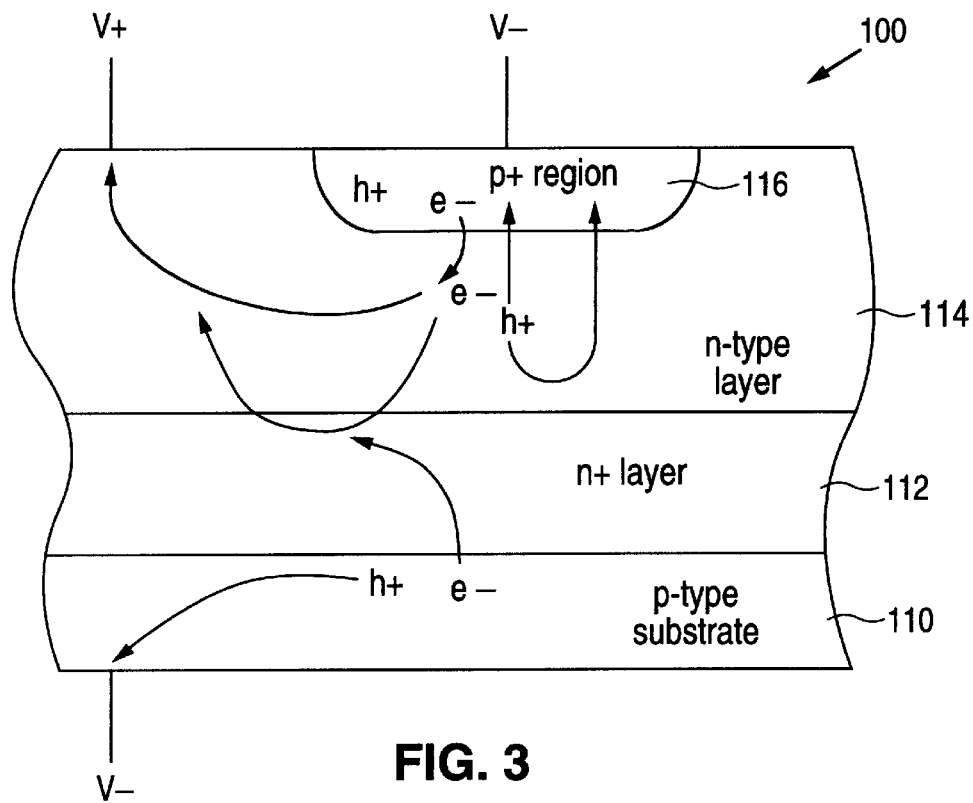
FIG. 3 is a cross-sectional diagram illustrating a p+/n photodiode 100 in accordance with the present invention.

FIG. 3 shows a cross-sectional diagram of a photodiode 100 in accordance with the present invention. As shown in FIG. 3, photodiode 100, which is formed in a p-type substrate 110, includes an n+ buried layer 112 formed on substrate 110, an n-type layer 114 formed on buried layer 112, and a p+ region 116 formed in n-type layer 114.

Figure 1:
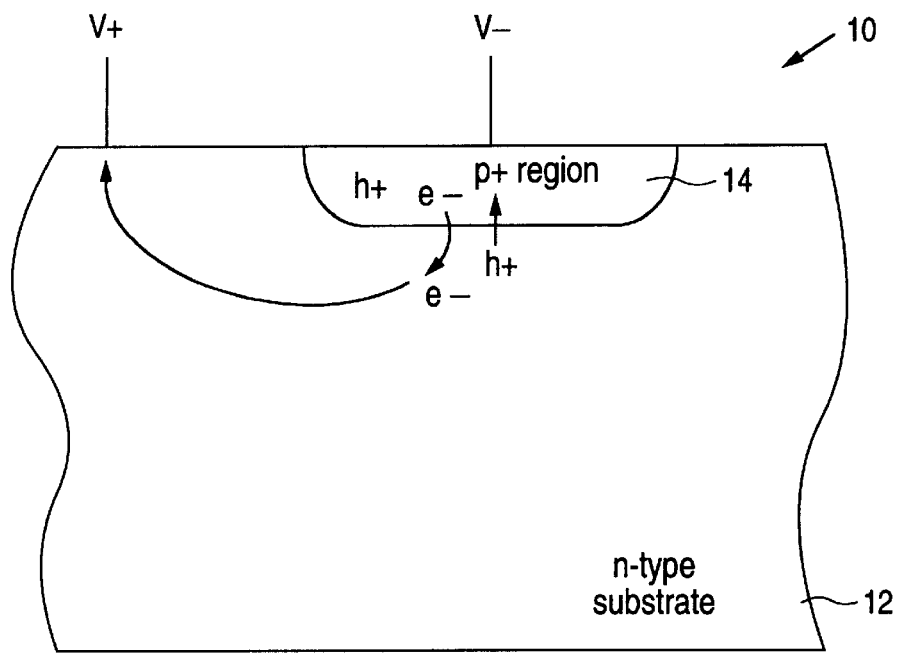
FIG. 1 is a cross-sectional diagram illustrating a conventional photodiode 10.
Figure 2:
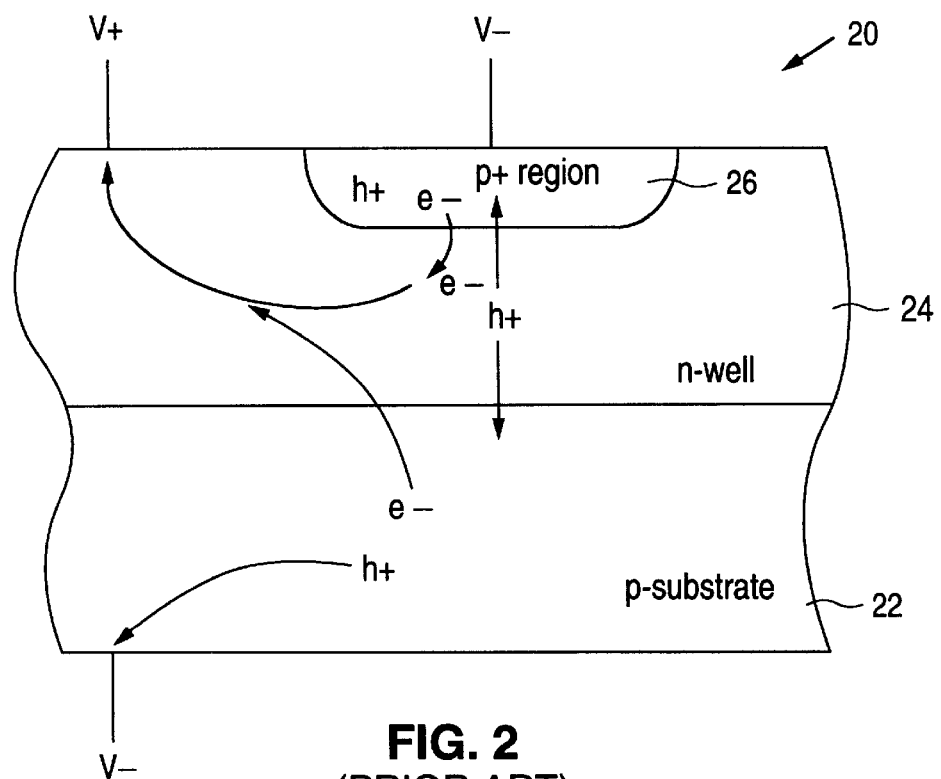
FIG. 2 is a cross-sectional diagram illustrating a conventional p+/n-well photodiode 20.

In operation, photodiode 100 operates the same as photodiode 20 of FIG. 2 except that n+ buried layer 112 of photodiode 100 is slightly more positive than n-type layer 114 due to the increased doping and, as a result, tends to reflect the holes formed in n-type layer 114 back to p+ region 116. As above, the electrons from these electron-hole pairs continue to be attracted to the positive voltage applied to n-type layer 114, regardless of whether the electrons pass through n+ buried layer 114 or not. Thus, n+ buried layer 112 reduces the number of photo-information holes that are lost to substrate 110, thereby increasing the quantum efficiency of photodiode 100.

In addition, the n+ buried layer/substrate junction also prevents thermally or otherwise generated holes originating in substrate 110 from diffusing up to p+ region 116, thereby maintaining the noise reduction common among p+/n-well photodiodes. Thus, photodiode 100 provides a structure which increases quantum efficiency while at the same time preventing holes representing noise from diffusing up from the substrate.

Another advantage of the present invention is that photodiode 100 provides automatic blooming in that whenever the potential on p+ region 116 is approximately 0.6 volts greater than the potential on n-type layer 114, the junction between the two regions becomes forward-biased.

The present invention also includes a method for balancing the red and blue photoresponses, and reducing the infra-red photoresponse of photodiode 100 by limiting the number of red and infra-red holes that can be collected by p+ region 116.

In a conventional photodiode, the red and blue photoresponses are not equal because blue photons are frequently blocked by structures overlying the photodiode. In addition, holes formed from blue photons are also frequently lost to surface interface states. As a result, more red holes are typically formed than blue holes. In addition, red and infra-red photons typically form electron-hole pairs below the surface of the photodiode, while blue photons form electron-hole pairs primarily at the surface of the photodiode.

In accordance with the present invention, photodiode 100 limits the number of red and infra-red holes that are collected by varying the thickness of n-type layer 114 which, in turn, varies the number of holes formed in substrate 110 and n-type layer 114. The thickness of n-type layer 114 is varied by removing a portion of n-type layer 114 until the depth of n-type layer is equal to a predetermined thickness.

By varying the thickness of n-type layer 114, the present invention takes advantage of the fact that red and infra-red photons can easily penetrate the p-n junction between n+ layer 112 and substrate 110, but that the electron-hole pairs which are formed from the red and infra-red photons can not diffuse up from substrate 110.

Thus, with a relatively thin n-type layer 114, fewer red and infra-red holes are formed in n-type layer 114 while more red and infra-red holes are formed in substrate 112 because more of the red and infra-red photons penetrate buried layer 112 and form electron-hole pairs in substrate 110.

Similarly, with a relatively thick n-type layer 114, more red and infra-red holes are formed in n-type layer 114 while fewer red and infra-red holes are formed in substrate 112 because fewer of the red and infra-red photons penetrate buried layer 112 and form electron-hole pairs in substrate 110. Thus, by setting the thickness of n-type layer 114 to a value that generates the same number of red holes as blue holes in n-type layer 114, the responses can be balanced. Further, since fewer red holes will be collected when balancing the red and blue photoresponses, fewer infra-red holes will also be collected.

Thus, a photodiode has been described with increased quantum efficiency, improved noise resistance, and balanced red and blue responses.

Figure 4:
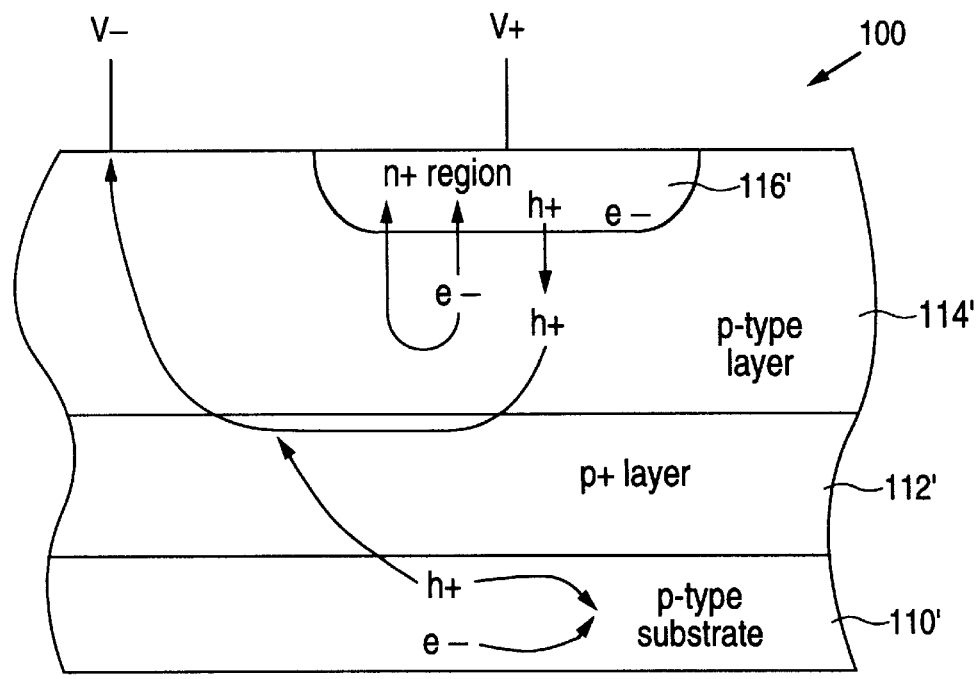
FIG. 4 is a cross-sectional diagram illustrating an n+/p photodiode 100 in accordance with the present invention.

It should be understood that various alternatives to the embodiment of the invention described herein may be employed in practicing the invention. For example, although the operation of the present invention has been described with respect to an p+/n-type layer photodiode, the present invention applies equally well to n+/p-type layer photodiodes as shown in FIG. 4. (A p-type substrate is preferred in the n+/p-type layer photodiode, however, an n-type substrate can also be used).

Thus, it is intended that the following claims define the scope of the invention and that methods and structures within the scope of these claims and their equivalents be covered thereby.

What is claimed is:

1. A method for forming a photodiode in a semiconductor substrate of a first conductivity type, the method comprising the steps of:

forming a first layer of semiconductor material of a second conductivity type on the substrate;

forming a second layer of semiconductor material of the second conductivity type on the first layer of semiconductor material, the first layer of semiconductor material having a greater concentration of dopants than the second layer of semiconductor material;

removing a portion of the second layer of semiconductor material until the second layer of semiconductor material has a predefined depth; and forming a region of the first conductivity type in the second layer of semiconductor material after the portion has been removed.

2. The method of claim 1 wherein the predefined depth is defined by a number of electron-hole pairs to be formed in the region and the second layer from red photons when the photodiode is exposed to a white light source for a predefined time.

3. The method of claim 2 wherein the number of electron-hole pairs formed from red photons during the predefined time is approximately equal to a number of electron-hole pairs formed from blue photons during the predefined time.

4. The method of claim 1 wherein the predefined depth is defined such that a number of electron-hole pairs formed in the region and the second layer from red photons and a number of electron-hole pairs formed in the region and the second layer from blue photons is approximately equal when exposed to a white light source for a predefined time.

5. The method of claim 4 wherein the first conductivity type includes n type, and the second conductivity type includes p type.

6. The method of claim 4 wherein the first conductivity type includes p type, and the second conductivity type includes n type.

7. A method for forming a photodiode in a semiconductor substrate of a first conductivity type, the method comprising the steps of:

forming a first layer of semiconductor material of a second conductivity type on the substrate;

forming a second layer of semiconductor material of the second conductivity type on the first layer of semiconductor material, the first layer of semiconductor material having a greater concentration of dopants than the second layer of semiconductor material;

removing a portion of the second layer of semiconductor material until the second layer of semiconductor material has a predefined depth; and forming a region of the first conductivity type in the second layer of semiconductor material after the portion has been removed, the predefined depth being defined such that a number of electron-hole pairs formed in the region and the second layer from red photons and a number of electron-hole pairs formed in the region and the second layer from blue photons is approximately equal when the photodiode is exposed to a white light source for a predefined time.

8. The method of claim 7 wherein the first conductivity type includes n type, and the second conductivity type includes p type.

9. The method of claim 7 wherein the first conductivity type includes p type, and the second conductivity type includes n type.

10. A method for forming a photodiode in a semiconductor substrate of a first conductivity type, the method comprising the steps of:

forming a first layer of semiconductor material of a second conductivity type on the substrate;

forming a second layer of semiconductor material of the second conductivity type on the first layer of semiconductor material, the first layer of semiconductor material having a greater concentration of dopants than the second layer of semiconductor material;

removing a portion of the second layer of semiconductor material until the second layer of semiconductor material has a predefined depth; and forming a region of the first conductivity type in the second layer of semiconductor material after the portion has been removed, the predefined depth being defined such that a predefined number of electron-hole pairs are formed in the region and the second layer from red photons when the photodiode is exposed to a white light source for a predefined time.

11. The method of claim 10 wherein the number of electron-hole pairs formed from red photons during the predefined time is approximately equal to a number of electron-hole pairs formed from blue photons during the predefined time.

12. The method of claim 10 or 11 wherein the first conductivity type includes n type, and the second conductivity type includes p type.

13. The method of claim 10 or 11 wherein the first conductivity type includes p type, and the second conductivity type includes n type.

* * * * *